United States Patent
Lee et al.

(10) Patent No.: US 11,688,561 B2
(45) Date of Patent: Jun. 27, 2023

(54) ELECTRONIC COMPONENT HAVING METAL FRAME FOR PREVENTING SPARKING AND SHORT CIRCUITS AND BOARD HAVING THE SAME

(71) Applicant: SAMSUNG ELECTRO-MECHANICS CO., LTD., Suwon-si (KR)

(72) Inventors: Young Heon Lee, Suwon-si (KR); Beom Joon Cho, Suwon-si (KR); Gyeong Ju Song, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 33 days.

(21) Appl. No.: 17/325,357

(22) Filed: May 20, 2021

(65) Prior Publication Data

US 2022/0093338 A1 Mar. 24, 2022

(30) Foreign Application Priority Data

Sep. 21, 2020 (KR) .................. 10-2020-0121563

(51) Int. Cl.
| | |
|---|---|
| *H01G 4/30* | (2006.01) |
| *H01G 2/06* | (2006.01) |
| *H01G 4/012* | (2006.01) |
| *H01G 4/12* | (2006.01) |
| *H01G 4/228* | (2006.01) |

(52) U.S. Cl.
CPC ............. *H01G 4/30* (2013.01); *H01G 2/065* (2013.01); *H01G 4/012* (2013.01); *H01G 4/1209* (2013.01); *H01G 4/228* (2013.01)

(58) Field of Classification Search
CPC .......... H01G 4/30; H01G 2/065; H01G 4/012; H01G 4/1209; H01G 4/228; H01G 2/06; H01G 4/232; H05K 2201/10015; H05K 2201/10946; H05K 3/3426; H05K 2201/10636; H05K 1/181; H05K 1/111; H05K 3/321
See application file for complete search history.

(56) References Cited

U.S. PATENT DOCUMENTS

| | | | | |
|---|---|---|---|---|
| 10,398,030 | B2* | 8/2019 | Park | H01G 4/30 |
| 2008/0239621 | A1* | 10/2008 | Tajuddin | H01G 4/248 |
| | | | | 361/306.1 |
| 2014/0160622 | A1* | 6/2014 | Chung | H05K 1/181 |
| | | | | 361/301.4 |
| 2016/0260546 | A1* | 9/2016 | Mori | H01G 4/30 |
| 2019/0008036 | A1* | 1/2019 | Park | H01G 4/30 |
| 2021/0358690 | A1* | 11/2021 | Iguchi | H01G 4/2325 |

FOREIGN PATENT DOCUMENTS

| | | |
|---|---|---|
| JP | 6160093 B2 | 7/2017 |
| JP | 2018-129435 A | 8/2018 |

* cited by examiner

*Primary Examiner* — David M Sinclair
*Assistant Examiner* — Daniel M Dubuisson
(74) *Attorney, Agent, or Firm* — Morgan, Lewis & Bockius LLP

(57) ABSTRACT

An electronic component includes: a capacitor body; a pair of external electrodes disposed on opposite end surfaces of the capacitor body, respectively; and a pair of metal frames respectively including a pair of connected portions connected to the pair of external electrodes, respectively, and a pair of mounted portions bent at and extending from one ends of the pair of connected portions, respectively, wherein corners of end portions of the pair of mounted portions facing each other have a curved surface.

16 Claims, 7 Drawing Sheets

II-II'

ELECTRONIC COMPONENT HAVING METAL FRAME FOR PREVENTING SPARKING AND SHORT CIRCUITS AND BOARD HAVING THE SAME

CROSS-REFERENCE TO RELATED APPLICATION(S)

This application claims the benefit of priority to Korean Patent Application No. 10-2020-0121563, filed on Sep. 21, 2020 in the Korean Intellectual Property Office, the disclosure of which is incorporated herein by reference in its entirety.

TECHNICAL FIELD

The present disclosure relates to an electronic component and a board having the same.

BACKGROUND

A multilayer capacitor has been used in various types of electronic apparatuses since it has a small size may implement high capacitance.

Recently, demand for an electronic component produced by connecting external electrodes of a multilayer capacitor to a circuit board with metal frames in order to implement a high voltage and increase capacitance has increased.

A high-voltage electronic component requires excellent performance at a high frequency and high levels of thermal and electrical reliability, and particularly requires a high level of durability against a high voltage in a limited space.

In such an electronic component using the metal frames, it is important to secure a distance between two metal frames mounted on the circuit board in order to suppress sparking and short circuits caused by a high voltage. Therefore, a length of mounted portions of the metal frames bonded to electrode pads of the circuit board is decreased.

However, when the length of the mounted portions is decreased as described above, fixing strength of the metal frames to the circuit board is decreased. Therefore, a risk that the electronic component will fall over at the time of being mounted on the circuit board increases.

SUMMARY

An aspect of the present disclosure may provide an electronic component in which fixing strength of metal frames may be maintained at a predetermined level or more and occurrence of sparking and short circuits may be reduced when a multilayer capacitor to which the metal frames are applied is mounted on a circuit board, and a board having the same.

According to an aspect of the present disclosure, an electronic component may include: a capacitor body; a pair of external electrodes disposed on opposite end surfaces of the capacitor body, respectively; and a pair of metal frames respectively including a pair of connected portions connected to the pair of external electrodes, respectively, and a pair of mounted portions bent at and extending from one ends of the pair of connected portions, respectively. Corners of end portions of the pair of mounted portions facing each other have a curved surface.

According to another aspect of the present disclosure, a board having an electronic component may include: circuit board having a plurality of electrode pads disposed on an upper surface of the circuit board; and an electronic component mounted on the circuit board. The electronic component includes a capacitor body, a pair of external electrodes disposed on opposite end portions surfaces of the capacitor body, respectively, and a pair of metal frames respectively including, respectively, a pair of connected portions connected to the pair of external electrodes, respectively, and a pair of mounted portions bent at and extending from lower one ends of the pair of connected portions, respectively, the pair of mounted portions being connected to the plurality of electrode pads, respectively. Corners of end portions of the pair of mounted portions facing each other having a curved surface.

The curvature of the corner of the end portion of the mounted portion may be 15 mm$^{-1}$ or less.

The electronic component may further include a conductive bonding layer disposed between the external electrode and the connected portion.

The capacitor body may include dielectric layers and a plurality of internal electrodes alternately disposed with each of the dielectric layers interposed therebetween.

The external electrode may include: a head portion disposed on one surface of the capacitor body; and a band portion extending from the head portion to portions of upper and lower surfaces and opposite side surfaces of the capacitor body.

According to still another aspect of the present disclosure, an electronic component may include: a capacitor body; a pair of external electrodes disposed on opposite end surfaces of the capacitor body, respectively; and a pair of metal frames connected to the pair of external electrodes, respectively, each metal frame having an L-shape. One end portions of the pair of metal frames facing each other each have a corner, a curvature of which is larger than zero.

The shortest distance between the pair of mounted portions may be 1.6 mm or less.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
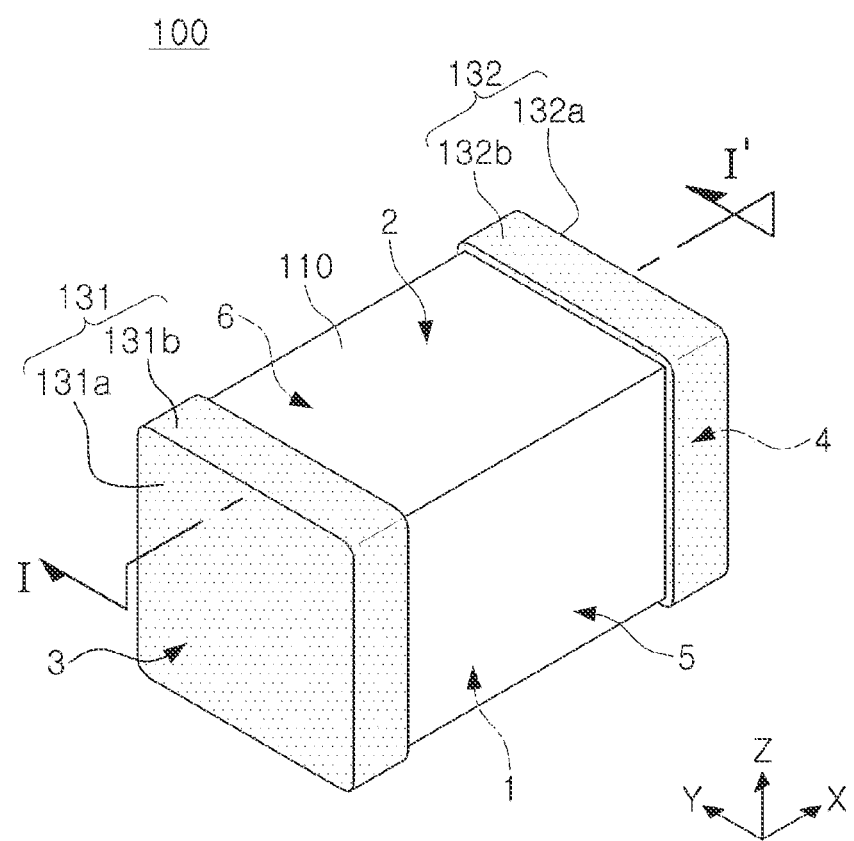
FIG. 1 is a schematic perspective view illustrating a multilayer capacitor according to an exemplary embodiment in the present disclosure.

Hereinafter, exemplary embodiments of the present disclosure will now be described in detail with reference to the accompanying drawings.

Directions will be defined in order to clearly describe exemplary embodiments in the present disclosure. X, Y and Z in the drawings refer to a length direction, a width direction, and a thickness direction of a multilayer capacitor and an electronic component, respectively.

Here, the Z direction may be used as the same concept as a stacked direction in which dielectric layers are stacked in the present exemplary embodiment.

Figure 2A:
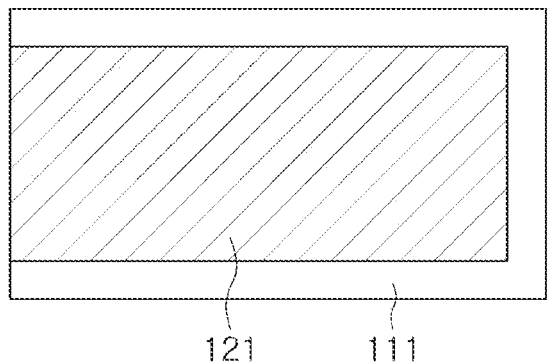
FIGS. 2A and 2B are plan views illustrating, respectively, first and second internal electrodes used in FIG. 1.
Figure 2B:
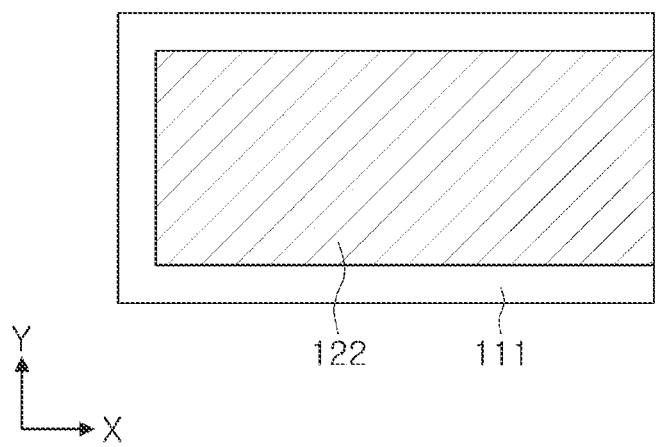
Figure 3:
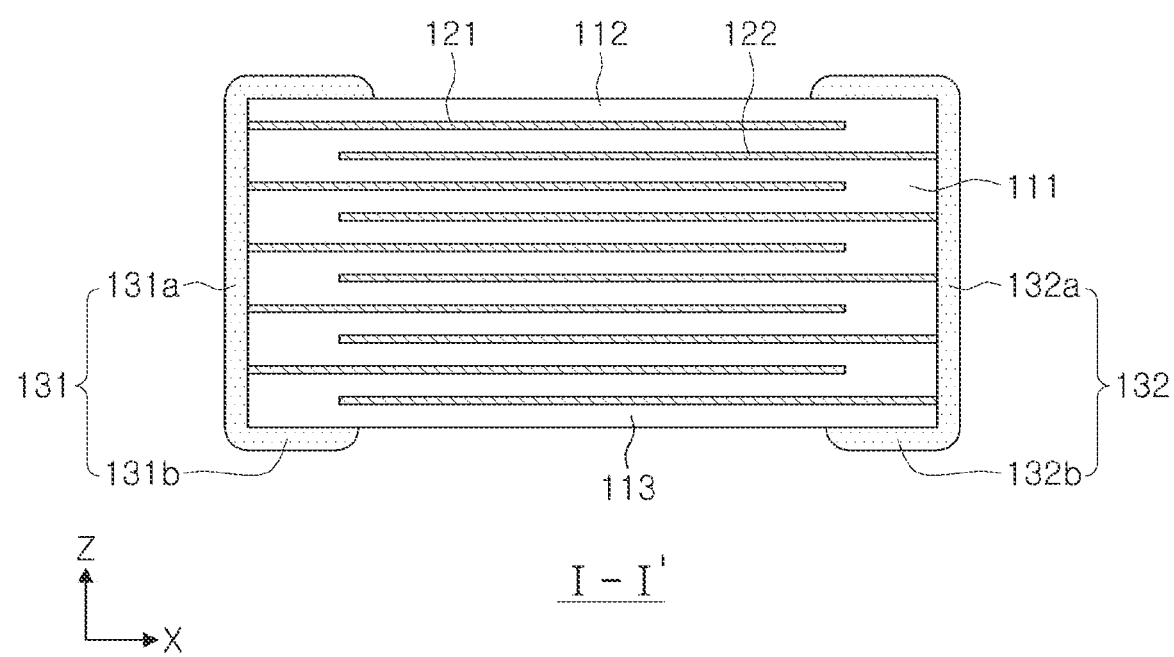
FIG. 3 is a cross-sectional view taken along line I-I' of FIG. 1.

FIG. 1 is a schematic perspective view illustrating a multilayer capacitor according to an exemplary embodiment in the present disclosure, FIGS. 2A and 2B are plan views illustrating, respectively, first and second internal electrodes used in FIG. 1, and FIG. 3 is a cross-sectional view taken along line I-I' of FIG. 1.

A structure of a multilayer capacitor 100 used in an electronic component according to the present exemplary embodiment will be described with reference to FIGS. 1 through 3.

The multilayer capacitor 100 according to the present exemplary embodiment may include a capacitor body 110 and first and second external electrodes 131 and 132 on opposite end surfaces of the capacitor body 110 in the X direction, respectively.

The capacitor body 110 may be formed by stacking a plurality of dielectric layers 111 in the Z direction and then sintering the plurality of dielectric layers 111.

Adjacent dielectric layers 111 of the capacitor body 110 may be integrated with each other so that boundaries therebetween are not readily apparent without using a scanning electron microscope (SEM).

In addition, the capacitor body 110 may include a plurality of dielectric layers 111 and first and second internal electrodes 121 and 122 alternately disposed in the Z direction with each of the dielectric layers 111 interposed therebetween. In this case, the first and second internal electrodes 121 and 122 may have different polarities.

In addition, the capacitor body 110 may include an active region and cover regions 112 and 113.

The active region may contribute to forming capacitance of the multilayer capacitor.

In addition, the cover regions 112 and 113 may be provided as margin portions on upper and lower surfaces of the active region in the Z direction, respectively.

The cover regions 112 and 113 may be formed by stacking a single dielectric layer or two or more dielectric layers on the upper and lower surfaces of the active region, respectively.

In addition, the cover regions 112 and 113 may basically serve to prevent the first and second internal electrodes 121 and 122 from being damaged due to physical or chemical stress.

A shape of the capacitor body 110 is not particularly limited, but may be substantially a hexahedral shape.

In the present exemplary embodiment, the capacitor body 110 may include first and second surfaces 1 and 2 opposing each other in the Z direction, third and fourth surfaces 3 and 4 connected to the first and second surfaces 1 and 2 and opposing each other in the X direction, and fifth and sixth surfaces 5 and 6 connected to the first and second surfaces 1 and 2, connected to the third and fourth surfaces 3 and 4, and opposing each other. Here, the first surface 1 may be a mounted surface.

In addition, a shape and a dimension of the capacitor body 110 and the number of stacked dielectric layers 111 are not limited to those illustrated in the drawings of the present exemplary embodiment.

The dielectric layer 111 may include ceramic powders such as $BaTiO_3$-based ceramic powders or the like.

An example of the $BaTiO_3$-based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca, Zr or the like, is partially solid-dissolved in $BaTiO_3$. However, the $BaTiO_3$-based ceramic powder according to the present disclosure is not limited thereto.

In addition, the dielectric layer 111 may further include a ceramic additive, an organic solvent, a plasticizer, a binder, a dispersant, and the like.

The ceramic additives may contain a transition metal oxide or a transition metal carbide, rare earth elements, magnesium (Mg), aluminum (Al), or the like.

The first and second internal electrodes 121 and 122 may be electrodes to which different polarities are applied.

The first and second internal electrodes 121 and 122 may be formed on the dielectric layers 111 and stacked in the Z direction, respectively.

In addition, the first and second internal electrodes 121 and 122 may be alternately disposed in the capacitor body 110 to face each other along the Z direction with each of the dielectric layers 111 interposed therebetween.

In this case, the first and second internal electrodes 121 and 122 may be electrically insulated from each other by each of the dielectric layers 111 disposed therebetween.

Meanwhile, a structure in which the plurality of internal electrodes are stacked in the Z direction has been illustrated and described in the present exemplary embodiment. However, the present disclosure is not limited thereto, and may also be applied to a structure in which the internal electrode are stacked in the Y direction, if necessary.

One end portion of the first internal electrode 121 may be exposed through the third surface 3 of the capacitor body 110.

The one end portion of the first internal electrode 121 exposed through the third surface 3 of the capacitor body 110 as described above may be electrically connected to the first external electrode 131 disposed on one end surface of the capacitor body 110 in the X direction.

One end portion of the second internal electrode 122 may be exposed through the fourth surface 4 of the capacitor body 110.

The one end portion of the second internal electrode 122 exposed through the fourth surface 4 of the capacitor body 110 as described above may be electrically connected to the second external electrode 132 disposed on the other end surface of the capacitor body 110 in the X direction.

According to the configuration as described above, when predetermined voltages are applied to the first and second external electrodes 131 and 132, electric charges may be accumulated between the first and second internal electrodes 121 and 122.

In this case, capacitance of the multilayer capacitor 100 may be in proportion to an area of the first and second internal electrodes 121 and 122 overlapping each other along the Z direction in the active region.

In addition, a material of each of the first and second internal electrodes 121 and 122 is not particularly limited.

In addition, the first and second internal electrodes 121 and 122 may be formed using a conductive paste formed of one or more of a noble metal material, nickel (Ni), and copper (Cu).

The noble metal material may be platinum (Pt), palladium (Pd), a palladium-silver (Pd—Ag) alloy, and the like.

In addition, a method of printing the conductive paste may be a screen printing method, a gravure printing method, or the like, but is not limited thereto.

Voltages having different polarities may be provided to the first and second external electrodes 131 and 132, respectively, and the first and second external electrodes 131 and 132 may be disposed on the opposite end surfaces of the capacitor body 110 in the X direction, respectively, and may be electrically connected to the exposed end portions of the first and second internal electrodes 121 and 122, respectively.

The first external electrode 131 may include a first head portion 131a and a first band portion 131b.

The first head portion 131a may be disposed on the third surface 3 of the capacitor body 110.

The first head portion 131a may be in contact with the end portions of the first internal electrodes 121 externally exposed through the third surface 3 of the capacitor body 110 to serve to electrically connect the first internal electrodes 121 and the first external electrode 131 to each other.

The first band portion 131b may extend from the first head portion 131a to portions of the first, second, fifth, and sixth surfaces 1, 2, 5, and 6 of the capacitor body 110.

The first band portion 131b may serve to improve fixing strength of the first external electrode 131.

The second external electrode 132 may include a second head portion 132a and a second band portion 132b.

The second head portion 132a may be disposed on the fourth surface 4 of the capacitor body 110.

The second head portion 132a may be in contact with the end portions of the second internal electrodes 122 externally exposed through the fourth surface 4 of the capacitor body 110 to serve to electrically connect the second internal electrodes 122 and the second external electrode 132 to each other.

The second band portion 132b may extend from the second head portion 132a to portions of the first, second, fifth, and sixth surfaces 1, 2, 5, and 6 of the capacitor body 110.

The second band portion 132b may serve to improve fixing strength of the second external electrode 132.

Meanwhile, the first and second external electrodes 131 and 132 may further include plating layers.

The plating layers may include first and second nickel (Ni) plating layers disposed on the capacitor body 110 and first and second tin (Sn) plating layers covering, respectively, the first and second nickel plating layers.

Figure 4:
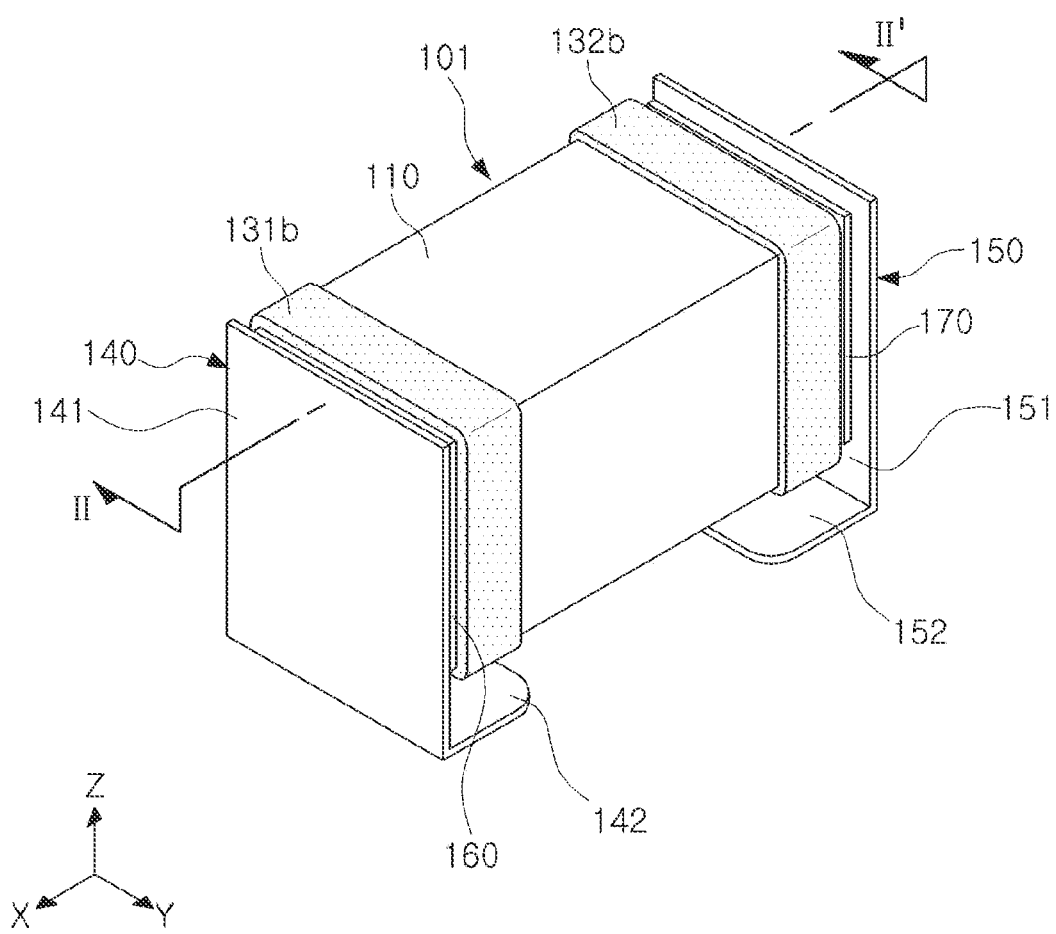
FIG. 4 is a schematic perspective view illustrating an electronic component according to an exemplary embodiment in the present disclosure.
Figure 5:
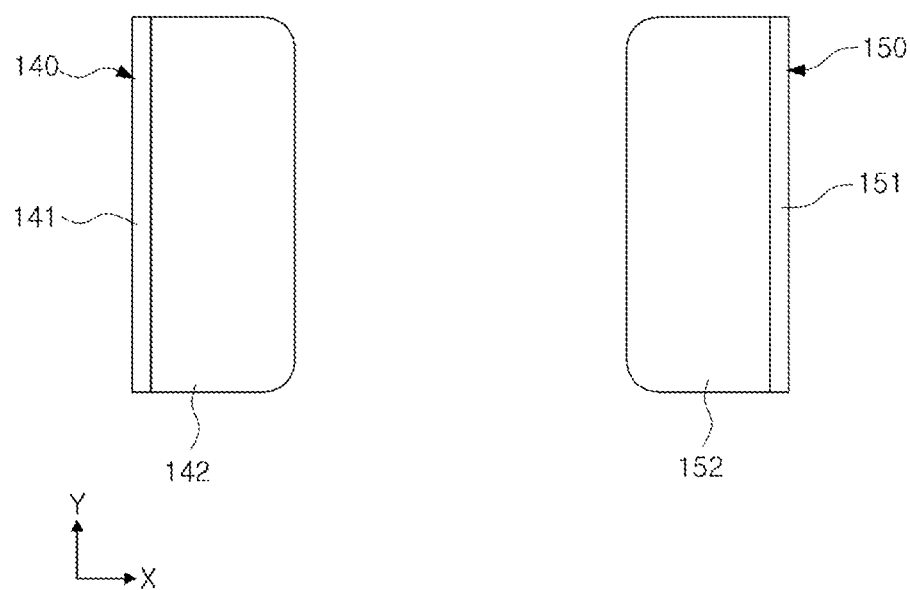
FIG. 5 is a plan view illustrating first and second metal frames in a state of separating the multilayer capacitor in FIG. 4.

FIG. 4 is a schematic perspective view illustrating an electronic component according to an exemplary embodiment in the present disclosure, and FIG. 5 is a plan view illustrating first and second metal frames in a state of separating the multilayer capacitor in FIG. 4.

Referring to FIGS. 4 and 5, an electronic component 101 according to the present exemplary embodiment may include a multilayer capacitor 100 including a capacitor body 110 and first and second external electrodes 131 and 132 and first and second metal frames 140 and 150 connected to the first and second external electrodes 131 and 132, respectively.

The first metal frame 140 may include a first connected portion 141 and a first mounted portion 142.

The first connected portion 141 may be bonded and physically connected to the first head portion 131a of the first external electrode 131, and may be electrically connected to the first head portion 131a of the first external electrode 131.

In this case, a first conductive bonding layer 160 may be disposed between the first head portion 131a of the first external electrode 131 and the first connected portion 141.

The first conductive bonding layer 160 may be formed of a high-temperature solder, a conductive bonding material or the like, and is not limited thereto.

The first mounted portion 142 may be bent at and extend from a lower end of the first connected portion 141 inwardly in the X direction, and be formed horizontal to the mounted surface.

The first mounted portion 142 may serve as a connection terminal at the time of mounting the electronic component 101 on a circuit board 210.

In this case, the first mounted portion 142 may be disposed to be spaced apart from a lower end of the multilayer capacitor 100.

The second metal frame 150 may include a second connected portion 151 and a second mounted portion 152.

The second connected portion 151 may be physically connected to the second head portion 132a of the second external electrode 132, and may be electrically connected to the second head portion 132a of the second external electrode 132.

In this case, a second conductive bonding layer 170 may be disposed between the second head portion 132a of the second external electrode 132 and the second connected portion 151.

The second conductive bonding layer 170 may be formed of a high-temperature solder, a conductive bonding material or the like, and is not limited thereto.

The second mounted portion 152 may be bent at and extend from a lower end of the second connected portion 151 inwardly in the X direction, and be formed horizontal to the mounted surface.

The second mounted portion 152 may serve as a connection terminal at the time of mounting the electronic component 101 on the circuit board 210.

In this case, the second mounted portion 152 may be disposed to be spaced apart from a lower end of the multilayer capacitor 100.

In addition, both corners of an end portion of the first mounted portion 142 facing the second mounted portion 152 in the X direction may be formed in a round shape so as to have a curvature larger than zero.

In addition, both corners of an end portion of the second mounted portion 152 facing the first mounted portion 142 in the X direction may be formed in a round shape so as to have a curvature larger than zero.

In this case, the curvature of both corners of the first mounted portion 142 in the X direction may be 15 $mm^{-1}$ or less, and the curvature of both corners of the second mounted portion 152 in the X direction may be 15 $mm^{-1}$ or less.

Table 1 represents evaluation results of a breakdown voltage depending on the curvature of the corner of the mounted portion of the metal frame.

The curvature of the corner of the mounted portion of the metal frame may be measured by a method to be described later.

Figure 7:
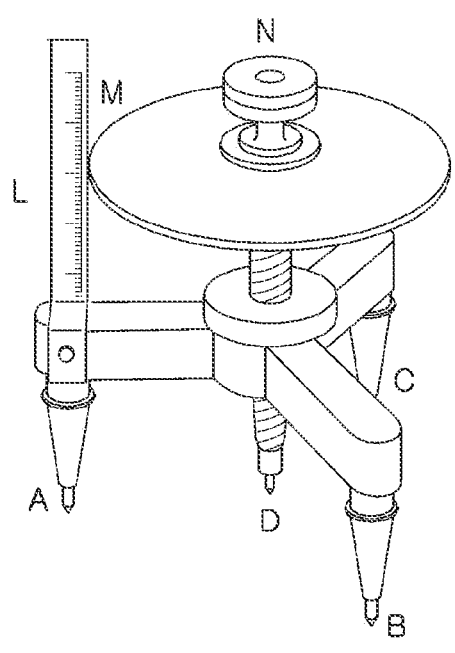
FIG. 7 is a view illustrating a spherometer and a principle of the spherometer.
Figure 7:
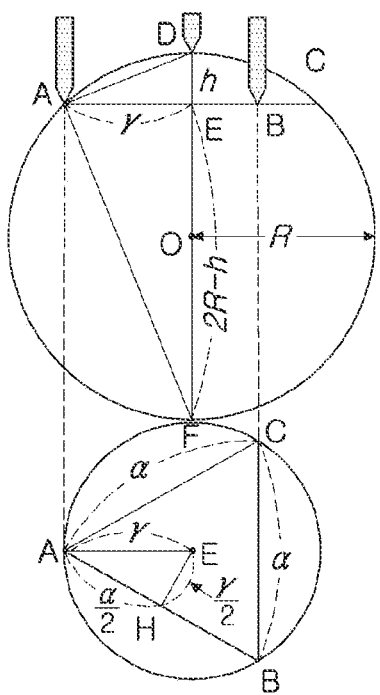

Referring to FIG. 7, a mounted portion of a metal frame of which a curvature is to be measured is first put on a spherometer, N is turned, and a vertical distance h between a plane ABC and a screw end D of a rotation shaft is obtained by reading gradations of a gradation L and a dial M at the moment when the screw end of the rotation shaft comes into contact with a spherical surface.

Then, a radius r of curvature may be obtained by measuring dimensions a and h in FIG. 7. Since a curvature κ

(kappa) is the reciprocal (1/r) of the radius of curvature, when r is obtained, a curvature κ of the corner may also be obtained.

Here, a length of a multilayer capacitor in the X direction and a width of the multilayer capacitor in the Y direction may be 3.2 mm and 2.5 mm, respectively, a distance from the mounted portion of the metal frame to the band portion of the external electrode in the Z direction may be 0.9 mm, and a width of the mounted portion of the metal frame in the Y direction may be 2.5 mm.

Discharge tests were performed while changing a magnitude of the curvature of the corner of the mounted portion for each of the shortest distances between two mounted portions facing each other, and discharge test results were represented in Tables 1 and 2, respectively.

Table 1 represents a case in which a length of the two mounted portions in the X direction is 0.8 mm and the shortest distance between the two mounted portions is 1.6 mm, and Table 2 represents a case in which a length of the two mounted portions in the X direction is 1.0 mm and the shortest distance between the two mounted portions is 1.2 mm.

Comparative Example is a case in which the corner of the mounted portion is bent at 90° and has no curvature.

TABLE 1

| Applied Voltage | Comparative Example | Curvature [mm$^{-1}$] | | | | | |
|---|---|---|---|---|---|---|---|
| | | 10 | 15 | 20 | 30 | 50 | 100 |
| 250 V | OK | OK | OK | OK | OK | OK | OK |
| 500 V | NG | OK | OK | OK | OK | OK | NG |
| 1000 V | NG | OK | OK | OK | NG | NG | NG |
| 1500 V | NG | OK | OK | NG | NG | NG | NG |
| 2000 V | NG | OK | OK | NG | NG | NG | NG |

TABLE 2

| Applied Voltage | Comparative Example | Curvature [mm$^{-1}$] | | | | | |
|---|---|---|---|---|---|---|---|
| | | 10 | 15 | 20 | 30 | 50 | 100 |
| 250 V | NG | OK | OK | OK | OK | OK | NG |
| 500 V | NG | OK | OK | OK | NG | NG | NG |
| 1000 V | NG | OK | OK | NG | NG | NG | NG |
| 1500 V | NG | OK | OK | NG | NG | NG | NG |
| 2000 V | NG | OK | OK | NG | NG | NG | NG |

Referring to Table 1, when the shortest distance between the two mounted portions is 1.6 mm, in a case of Comparative Example in which the curvature is not formed in the mounted portion, a short circuit occurred in all of the applied voltages of 500 V or higher.

On the other hand, in a case of Inventive Example in which the curvature is formed at the corner of the mounted portion, occurrence of a short circuit was decreased, and a short circuit did not occur up to an applied voltage of 2000 V, particularly at the curvature of the corner of the mounted portion of 15 mm$^{-1}$ or less.

In addition, referring to Table 2, even in a case in which the shortest distance between the two mounted portions is decreased to 1.2 mm by increasing the length of the mounted portions of the metal frames in the X direction in order to increase mounting stability of the electronic component, a short circuit did not occur up to an applied voltage of 2000 V at the curvature of the corner of the mounted portion of 15 mm$^{-1}$ or less.

Therefore, it may be seen that the curvature of the corner of the mounted portion of the metal frame is preferably 15 mm$^{-1}$ or less when considering a surge voltage in addition to a rated voltage of the electronic component.

Figure 6:
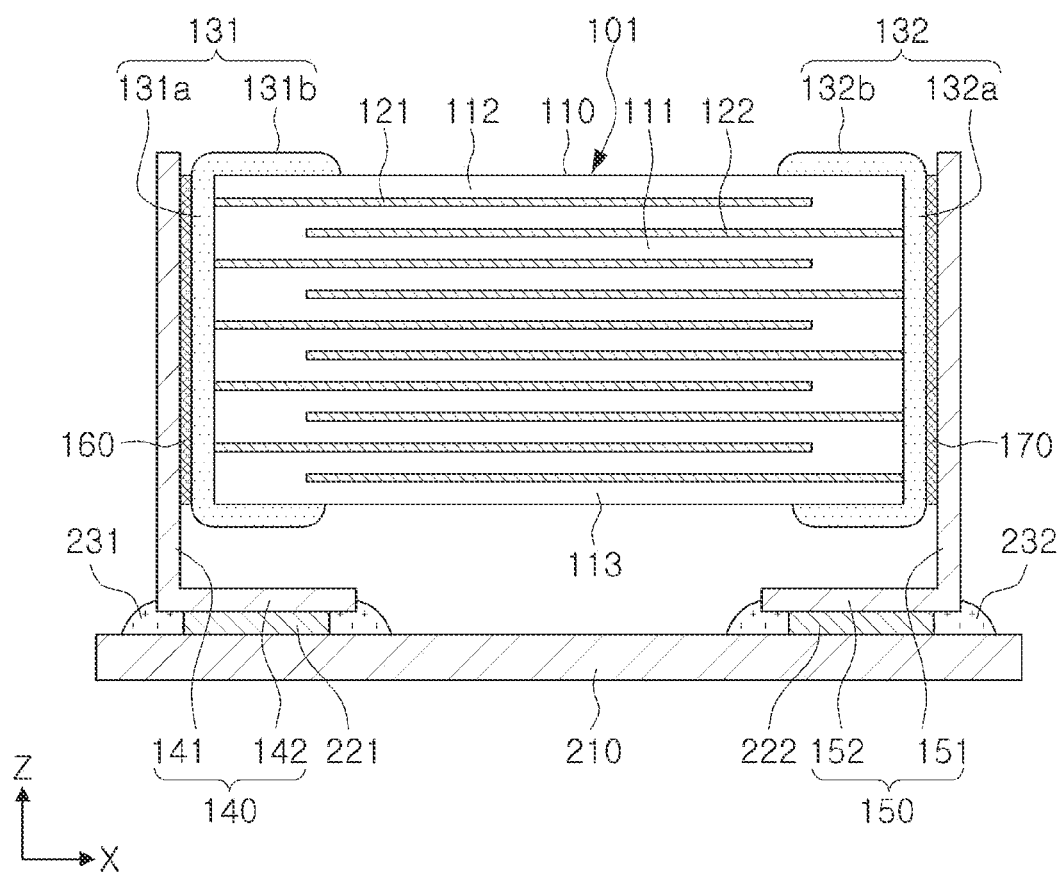
FIG. 6 is a cross-sectional view illustrating a board in which the electronic component of FIG. 4 is mounted.

FIG. 6 is a cross-sectional view illustrating a board in which the electronic component of FIG. 4 is mounted.

A board according to the present exemplary embodiment may include a circuit board 210 and first and second electrode pads 221 and 222 disposed on an upper surface of the circuit board 210 so as to be spaced apart from each other in the X direction.

In this case, the electronic component 101 may be mounted on the circuit board 210 in a state in which the first and second mounted portions 142 and 152 of the first and second metal frames 140 and 150 positioned on the first and second electrode pads 221 and 222, respectively, so as to be in contact with the first and second electrode pads 221 and 222, respectively.

The first mounted portion 142 may be bonded and electrically and physically connected to the first electrode pad 221 by a solder 231, and the second mounted portion 152 may be bonded and electrically and physically connected to the second electrode pad 222 by a solder 232.

In the electronic component according to the present exemplary embodiment, a gap between the multilayer capacitor 100 and the circuit board 210 may be secured by bonding the first and second metal frames 140 and 150 to both end portions of the multilayer capacitor 100, respectively.

Therefore, when the electronic component 101 is mounted on the circuit board 210, stress may not be directly transferred from the circuit board 210 to the multilayer capacitor 100, such that thermal reliability, electrical reliability, mechanical reliability, and the like, of the electronic component 101 may be improved.

In addition, the corners of the end portions of the first and second mounted portions 142 and 152 facing each other in the X direction may be formed in the round shape so as to have the curvature.

That is, peak points may not be formed at both corners of the end portion of the first mounted portion 142, such that a phenomenon in which electric fields are concentrated at the peak points of the first mounted portion 142 due to a high voltage, a surge voltage or the like in the related art may be prevented.

In addition, peak points may not be formed at both corners of the end portion of the second mounted portion 152, such that a phenomenon in which electric fields are concentrated at the peak points of the second mounted portion 152 due to a high voltage, a surge voltage or the like in the related art may be prevented.

Therefore, occurrence of sparking and short circuits between the first mounted portion 142 and the second mounted portion 152 may be prevented, such that an electronic component appropriate for a high voltage environment without a side effect caused by increasing a length of the electronic component or decreasing an area of the mounted portions in order to increase a distance between the mounted portions in the related art may be implemented.

As set forth above, according to an exemplary embodiment, the corners of the end portions of the first and second mounted portions of the first and second metal frame facing each other may be formed to have the curvature, such that occurrence of the spark and the short circuit may be reduced and fixing strength of the metal frames may be maintained at a predetermined level or more, at the time of mounting the electronic component on the circuit board, without increasing the length of the multilayer capacitor or decreasing the length of the mounted portion.

While exemplary embodiments have been shown and described above, it will be apparent to those skilled in the art that modifications and variations could be made without departing from the scope of the present invention as defined by the appended claims.

What is claimed is:

1. An electronic component comprising:
   a capacitor body;
   a pair of external electrodes disposed on opposite end surfaces of the capacitor body, respectively; and
   a pair of metal frames respectively including a pair of connected portions connected to the pair of external electrodes, respectively, and a pair of mounted portions bent at and extending from one ends of the pair of connected portions, respectively,
   wherein corners of end portions of the pair of mounted portions facing each other have a curved surface, and
   wherein a curvature of the corners of the end portions of the pair of mounted portions is 15 mm$^{-1}$ or less.

2. The electronic component of claim 1, further comprising a pair of conductive bonding layers disposed between the pair of external electrodes and the pair of connected portions, respectively.

3. The electronic component of claim 1, wherein the capacitor body includes dielectric layers and a plurality of internal electrodes alternately disposed with each of the dielectric layers interposed therebetween.

4. The electronic component of claim 1, wherein each of the pair of external electrodes includes:
   a head portion disposed on one end surface among the opposite end surfaces of the capacitor body; and
   a band portion extending from the head portion onto parts of first and second surfaces and opposite side surfaces of the capacitor body, that are connected to the one end surface.

5. A board having an electronic component, comprising:
   a circuit board having a plurality of electrode pads disposed on an upper surface of the circuit board; and
   an electronic component mounted on the circuit board,
   wherein the electronic component includes a capacitor body, a pair of external electrodes disposed on opposite end surfaces of the capacitor body, respectively, and a pair of metal frames respectively including a pair of connected portions connected to the pair of external electrodes, respectively, and a pair of mounted portions bent at and extending from one ends of the pair of connected portions, respectively, the pair of mounted portions being connected to the plurality of electrode pads, respectively,
   wherein corners of end portions of the pair of mounted portions facing each other have a curved surface, and
   wherein a curvature of the corners of the end portions of the pair of mounted portions is 15 mm$^{-1}$ or less.

6. The board of claim 5, wherein the electronic component further includes a pair of conductive bonding layers disposed between the pair of external electrodes and the pair of connected portions, respectively.

7. The board of claim 5, wherein the capacitor body includes dielectric layers and a plurality of internal electrodes alternately disposed with each of the dielectric layers interposed therebetween.

8. The board of claim 5, wherein each of the pair of external electrodes includes:
   a head portion disposed on one end surface among the opposite end surfaces of the capacitor body; and
   a band portion extending from the head portion onto parts of first and second surfaces and opposite side surfaces of the capacitor body, that are connected to the one end surface.

9. The board of claim 5, wherein the pair of mounted portions are electrically and physically connected to the plurality of electrode pads, respectively, by a solder.

10. The board of claim 5, wherein a length of each of the pair of mounted portions in a first direction is larger than a length of each of the plurality of electrode pads in the first direction, where the first direction is a direction in which the opposite end surfaces of the capacitor body oppose each other.

11. An electronic component comprising:
    a capacitor body;
    a pair of external electrodes disposed on opposite end surfaces of the capacitor body, respectively; and
    a pair of metal frames connected to the pair of external electrodes, respectively, each metal frame having an L-shape,
    wherein one end portions of the pair of metal frames facing each other each have a corner, a curvature of which is larger than zero, and
    wherein the curvature of the corners of the one end portions of the pair of metal frames is 15 mm$^{-1}$ or less.

12. The electronic component of claim 11, wherein the pair of metal frames respectively include a pair of connected portions connected to the pair of external electrodes, respectively, and a pair of mounted portions bent at and extending from one ends of the pair of connected portions, respectively.

13. The electronic component of claim 12, further comprising a pair of conductive bonding layers disposed between the pair of external electrodes and the pair of connected portions, respectively.

14. The electronic component of claim 12, the shortest distance between the pair of mounted portions is 1.6 mm or less.

15. The electronic component of claim 11, wherein the capacitor body includes dielectric layers and a plurality of internal electrodes alternately disposed with each of the dielectric layers interposed therebetween.

16. The electronic component of claim 11, wherein each of the pair of external electrodes includes:
    a head portion disposed on one end surface among the opposite end surfaces of the capacitor body; and
    a band portion extending from the head portion onto parts of first and second surfaces and opposite side surfaces of the capacitor body, that are connected to the one end surface.

* * * * *